United States Patent
Lell et al.

(10) Patent No.: US 8,340,146 B2
(45) Date of Patent: Dec. 25, 2012

(54) RADIATION-EMITTING SEMICONDUCTOR CHIP

(75) Inventors: Alfred Lell, Maxhuette-Haidhof (DE); Christoph Eichler, Tegernheim (DE); Christian Rumbolz, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 101 days.

(21) Appl. No.: 12/679,832

(22) PCT Filed: Aug. 27, 2008

(86) PCT No.: PCT/DE2008/001423
§ 371 (c)(1),
(2), (4) Date: Jun. 28, 2010

(87) PCT Pub. No.: WO2009/039811
PCT Pub. Date: Apr. 2, 2009

(65) Prior Publication Data
US 2010/0278203 A1    Nov. 4, 2010

(30) Foreign Application Priority Data

Sep. 28, 2007 (DE) .......... 10 2007 046 497
Dec. 14, 2007 (DE) .......... 10 2007 060 204

(51) Int. Cl.
*H01S 5/00* (2006.01)
(52) U.S. Cl. .................................. 372/45.01
(58) Field of Classification Search ........... 372/45.01
See application file for complete search history.

(56) References Cited

U.S. PATENT DOCUMENTS

| 4,664,748 | A | 5/1987 | Ueno et al. | |
|---|---|---|---|---|
| 6,515,305 | B2 | 2/2003 | Gopinath | |
| 7,489,068 | B2 | 2/2009 | Hsieh et al. | |
| 2002/0079497 | A1 | 6/2002 | Gopinath | |
| 2004/0264533 | A1* | 12/2004 | Matsumura et al. | 372/45 |
| 2006/0163595 | A1* | 7/2006 | Hsieh et al. | 257/95 |
| 2006/0193353 | A1 | 8/2006 | Kim et al. | |
| 2006/0204865 | A1 | 9/2006 | Erchak et al. | |
| 2007/0295981 | A1* | 12/2007 | Erchak et al. | 257/98 |

FOREIGN PATENT DOCUMENTS

| DE | 10 2006 017 573 A1 | 10/2007 |
|---|---|---|
| EP | 0 180 222 A2 | 5/1986 |
| EP | 1 012 933 B1 | 6/2000 |
| JP | 10-163525 A | 6/1998 |
| WO | WO-2006/096767 A1 | 9/2006 |

OTHER PUBLICATIONS

Schnitzer, I., et al., "30% External Quantum Efficiency from Surface Textured, Thin-Film Light-Emitting Diodes," Applied Physics Letters, Oct. 1993, pp. 2174-2176, vol. 63, No. 16, American Institute of Physics, Woodbury, New York, United States.

Windisch, R., et al., "40% Efficient Thin-Film Surface-Textured Light-Emitting Diodes by Optimization of Natural Lithography," IEEE Transactions on Electronic Devices, Jul. 2000, pp. 1492-1498, vol. 47, No. 7, IEEE.

* cited by examiner

*Primary Examiner* — Patrick Stafford
(74) *Attorney, Agent, or Firm* — Slater & Matsil, L.L.P.

(57) ABSTRACT

The invention relates to a radiation-emitting semiconductor chip, comprising an active zone for generating radiation having a wavelength lambda and a structured region having irregularly arranged structure elements which contain a first material having a first refractive index $n_1$ and which are surrounded by a medium comprising a second material having a second refractive index $n_2$. A method for producing a semiconductor chip of this type is furthermore specified.

11 Claims, 6 Drawing Sheets

PRIOR ART

PRIOR ART

RADIATION-EMITTING SEMICONDUCTOR CHIP

This patent application is a national phase filing under section 371 of PCT/DE2008/001423, filed Aug. 27, 2008, which claims the priority of German patent applications 10 2007 046 497.7, filed Sep. 28, 2007, and 10 2007 060 204.0, filed Dec. 14, 2007, each of which is incorporated herein by reference in its entirety.

TECHNICAL FIELD

The invention relates to a radiation-emitting semiconductor chip and a method for producing the same.

BACKGROUND

Radiation-generating semiconductor chips typically contain semiconductor materials, the refractive index of which is relatively high in comparison with a surrounding medium, for example, air. The consequence of this is that total reflections can occur when radiation is coupled out at an interface between the semiconductor chip and the surrounding medium, which leads to a reduced luminous efficiency.

SUMMARY

In one embodiment, a radiation-emitting semiconductor chip has an improved luminous efficiency.

In another embodiment, a production method for such a radiation-emitting semiconductor chip is specified.

The present invention is based, inter alia, on the concept of setting in a desired manner a refractive index transition that occurs between a first medium having a first refractive index and a second medium having a second refractive index, by means of the form, size and/or density of structure elements. By means of the corresponding setting, a relatively large or relatively small, gradual or continuous refractive index transition can be produced in an application-related manner.

In accordance with one embodiment of the invention, the radiation-emitting semiconductor chip includes an active zone for generating radiation having the wavelength $\lambda$ and also a structured region including irregularly arranged structure elements that contain a first material having a first refractive index $n_1$ and that are surrounded by a medium including a second material having a second refractive index $n_2$. In the present case, the wavelength $\lambda$ denotes the wavelength in the respective medium in which the radiation propagates.

In one advantageous development, the structure elements each have a width $b \leq 4$ µm and a distance $a \leq 4$ µm from one another. In particular, the structure elements can each have a width $b \leq \lambda$ and a distance $a \leq \lambda$ from one another.

It is advantageous that, in the structuring of the region, it is not necessary to comply with a regular arrangement of the structure elements. By way of example, a structure element can be at a different distance a from each directly adjacent structure element, although the distance a is at most 4 µm. Furthermore, the individual structure elements can have different widths b, although the latter are preferably not greater than 4 µm. In the present case, the width b denotes the longest dimension of a cross-sectional area of the respective structure element at half the height h/2. In the case of a circular cross-sectional area, the longest dimension of the cross-sectional area corresponds to the diameter. The cross-sectional area is arranged parallel to a base area of the structure element. The height h is the longest dimension of the structure element proceeding from the base area and perpendicular to the base area.

In the context of the invention, there are two preferred ranges of values for the width b, namely $b \leq \lambda$ and $\lambda \leq b \leq 4$ µm. If $b \leq \lambda$, then the structure elements "blur" for an optical wave. If $\lambda \leq b \leq 4$ µm, then the structure elements constitute scattering centers for the optical wave.

In accordance with one embodiment, the medium can completely fill the interspaces between the structure elements. It is also possible, however, for the medium to have inclusions, for example, air inclusions, by which an effective refractive index $n_{eff}$ can be reduced.

In a further-embodiment, the structure elements project from a planar surface of a first layer. The first layer can, for example, belong to a stack of epitaxially grown semiconductor layers from which the semiconductor chip is formed, or else be a separate layer arranged on the stack. The structure elements can have the same refractive index as the first layer.

Preferably, a second layer is applied on the first layer, the second layer containing the second material and filling the cavities between the structure elements. In this case, the second layer corresponds to the medium already mentioned.

For the following considerations, an interlayer is introduced that includes the structure elements and the medium and thus contains the first and the second material. The interlayer therefore contains a mixed material, that is to say a mixture composed of the first material and the second material. In accordance with the definition used here, the thickness of the interlayer corresponds to the height of the longest structure element. The structure elements have a width for which $b \leq \lambda$, also $b \leq \lambda/4$ at longer wavelengths, holds true. In the case of such a size of the structure elements, an optical wave that impinges on the interlayer no longer perceives the boundary between the structure elements and the medium, that is to say the boundary between the first and the second material, but rather experiences the interlayer as a homogeneous layer having an effective refractive index $n_{eff}$. Since the interlayer contains a mixture composed of the first and the second material, the effective refractive index $n_{eff}$ of the mixed material lies between the first refractive index $n_1$ and the second refractive index $n_2$. In particular, it holds true for the interlayer that $n_2 < n_{eff} < n_1$. However, it is also possible that $n_1 < n_{eff} < n_2$.

The effective refractive index $n_{eff}$ is advantageously set by the concentration of the first material relative to the concentration of the second material in the interlayer. If the concentration of the first material is predominant, this results in an effective refractive index $n_{eff}$, which comes closer to the first refractive index $n_1$ than to the second refractive index $n_2$. If the concentration of the second material is predominant, then the opposite holds true.

In order to obtain the effective refractive index $n_{eff}$, it is advantageous if a base area width g of the respective structure elements is less than the height h of the respective structure elements. In the present case, the base area width g should be understood as the longest dimension of the base area of the structure element. In the case of a circular base area, the base area width g corresponds to the diameter. In particular, the following holds true for the ratio $g:h \leq 1:10$.

Different embodiments of a semiconductor chip according to the present invention are described below, wherein the different embodiments illustrate different functions of the structured region.

In one advantageous embodiment, the radiation-emitting semiconductor chip is a laser diode chip. It is advantageous that, by means of the structured region that is arranged at a suitable location, higher kink levels can be obtained in comparison with conventional semiconductor lasers, that is to say that higher radiation powers can be achieved without transverse mode jumps occurring.

In particular, the laser diode chip is a stripe laser. The stripe laser can include a ridge, wherein the structured region is preferably arranged at the sidewalls of the ridge. At the sidewalls, the structured region can advantageously be used for mode attenuation.

In accordance with one exemplary embodiment, the stripe laser includes a ridge that reaches as far as the active zone or even extends through the active zone. This has the advantage that relatively low current spreading and thus a low threshold current can be obtained. In the case of a conventional laser having no structured region at the sidewalls, however, a relatively large refractive index jump occurs between the ridge and a surrounding medium, typically a dielectric. Transverse modes are guided thereby, which impair the beam quality. By contrast, in the case of the present exemplary embodiment, the refractive index jump can be reduced by means of the structured region. In particular, the structure elements are coated by a passivation layer having the second refractive index $n_2$. By way of example, the passivation layer can contain a silicon oxide. The structure elements are preferably formed from a semiconductor layer of the semiconductor chip. The reduction of the refractive index jump has the consequence that only one transverse mode is guided. The far field of the laser diode chip, therefore, can be improved and the low threshold current can be maintained. Furthermore, the passivation layer is interlinked with the semiconductor layer by means of the structure elements, such that it adheres better on the semiconductor layer.

In accordance with a further exemplary embodiment of the stripe laser, the structure elements are coated by an absorber layer. It is thereby possible in turn to reduce the refractive index jump between the semiconductor layer, from which the structure elements are preferably etched, and the absorber layer. The penetration depth of an optical wave can thus be increased and the interaction of the optical wave with the absorber layer can be improved. This results in a better attenuation of higher transverse modes.

Preferably, the absorber layer contains an oxide or nitride of Si, Ti, Al, Ga, Nb, Zr, Ta, Hf, Zn, Mg, Rh, In.

In a further exemplary embodiment, an absorber layer can be arranged on the passivation layer.

What is common to all these exemplary embodiments is that, on account of the reduced refractive index jump that can be obtained by means of the structure elements being coated, an optical wave can penetrate more deeply into the passivation layer or the absorber layer, whereby a better attenuation of higher modes is obtained.

In one embodiment, the radiation-emitting semiconductor chip includes a laser array containing a plurality of stripe lasers and a plurality of structured regions. Preferably, a structured region is in each case arranged between two stripe lasers. By means of the structure elements it is possible, on the one hand, if $b \leq \lambda$ or, at longer wavelengths, $b \leq \lambda/4$ holds true, to reduce a refractive index transition between the layer from which the structure elements project and the surrounding medium and thereby to improve the coupling-out of radiation. However, even if $\lambda \leq b \leq 4$ µm, the scattered light can couple out better on account of scattering at the structure elements. This has the advantage that scattered light, which could couple with crosstalk to adjacent stripe lasers or lead to ring modes, is better suppressed.

In a further embodiment, the radiation-emitting semiconductor chip includes a dielectric mirror. In particular, the structure elements are formed from a first layer of the dielectric mirror and surrounded by a second layer of the dielectric mirror. Preferably, the first layer contains the first material having the first refractive index $n_1$ and the second layer contains the second material having the second refractive index $n_2$. By means of the structure elements being coated, an optical wave can better penetrate the second layer and interact with the latter, on account of the reduced refractive index jump. Preferably, the second layer contains inclusions, in particular air inclusions, having a refractive index that is less than the second refractive index $n_2$. As a result, the second refractive index $n_2$ and thus the effective refractive index $n_{eff}$ can be reduced. This has the advantage that the critical angle of total reflection is reduced, such that a larger proportion of radiation can be reflected in the direction of a coupling-out side of the radiation-emitting semiconductor chip by means of total reflection occurring at the dielectric mirror. The first and the second layer can each contain an oxide, nitride or oxynitride of Si, Ti, Al, Ga, Nb, Zr, Ta, Hf, Zn, Mg, Rh, In.

In a further embodiment of the radiation-emitting semiconductor chip according to the invention, the structured region is arranged in the active zone. In particular, the structured region forms a quantum well structure. In the context of the application, the designation quantum well structure encompasses, in particular, any structure in which charge carriers can undergo a quantization of their energy states as a result of confinement. In particular, the designation quantum well structure does not include any indication about the dimensionality of the quantization. It, therefore, encompasses, inter alia, quantum wells, quantum wires and quantum dots and any combination of these structures. An improved confinement of the charge carriers can be obtained by means of the structured region.

In a further configuration of the radiation-emitting semiconductor chip, a base area width g of the respective structure elements is greater than the height h of the respective structure elements. In particular, it is possible that the ratio $g:h \geq 10:1$. In particular, the width b of the structure elements is in this case $\lambda \leq b \leq 4$ µm.

In this configuration, the structured region is particularly suitable as a coupling-out layer.

In a light-emitting diode, the structured region is preferably disposed downstream of the active zone in a main emission direction. By means of the structured region serving as a coupling-out layer, the coupling-out of radiation and thus the output power can be improved.

Furthermore, in a laser diode chip, which, in particular, is a stripe laser including a ridge, the structured region can serve as a coupling-out layer for coupling out scattered light. For this purpose, the structured region is preferably arranged alongside the ridge. In this case, the scattered light propagates perpendicularly to the laser light and impinges on the structured region where it can couple out. It is thereby possible to improve the emission behavior at the laser facet and to suppress superluminescence.

In all the described embodiments of a radiation-emitting semiconductor chip according to the invention, the structure elements can be cones or polyhedra, in particular pyramids or cylinders.

Various methods are appropriate for producing the structured region described above. What is common to all the methods is that a mask is used that provides for a random arrangement of the structure elements.

In accordance with one preferred method for producing a radiation-emitting semiconductor chip according to the invention a mask layer is applied to partial regions of the region to be structured. The mask layer does not completely cover the region to be structured.

The mask layer can, for example, by means of vapor deposition or sputtering, be applied relatively thinly to the region to be structured, such that a closed layer does not arise. In this case, the mask layer can have a thickness that is less than 50 nm, in particular less than 20 nm. Metals, for example Ni, Ti or Pt, dielectric materials, for example, an oxide or nitride of Si, Ti or Zr or polymers, for example, photoresists, are suitable for the mask layer. However, it is also possible to use a thicker layer as mask layer, which is subjected to heat treatment after application to the region to be structured. Cavities or interruptions can be formed as a result of this.

A further possibility for forming the mask layer consists in structuring the closed mask layer by means of lithography and thereby producing interruptions.

Furthermore, the mask layer can contain an inhomogeneous material from which material constituents are dissolved wet-chemically or which can be removed to different extents during subsequent dry-chemical etching, such that the mask layer consequently has irregularly arranged interruptions.

As soon as the mask layer has been created, the region to be structured, for example, a semiconductor layer of the semiconductor chip or a dielectric layer of the dielectric mirror, can be structured by etching being effected in the interruptions of the mask layer. The structure elements are left in the process. In particular, an anisotropic etching method such as dry-chemical etching, for instance, is suitable. The mask layer is preferably stripped away after the etching process. The structured region then includes the structure elements.

In another embodiment for producing a radiation-emitting semiconductor chip according to the invention a mask material is arranged at a distance from the region to be structured. During an etching process, the mask material is at least partly removed and deposits on the region to be structured, wherein the region to be structured is simultaneously etched, such that the structure elements are formed.

By way of example, the semiconductor chip can be arranged on a carrier on which the mask material is arranged alongside the semiconductor chip or surrounds the latter. In this case, the mask material serves as a target. During an etching process that is carried out, for example, to impart the desired form to the semiconductor chip, the mask material is at least partly removed, in particular etched away. The removed mask material can deposit on the region to be structured, whereby a mask layer with interruptions is produced. The mask layer can have very densely arranged and fine structures. Since the etching process is preferably continued during the depositing of the mask material, the region to be structured can simultaneously be etched, such that the structure elements are formed. It is advantageous, therefore, that the production and the etching of the mask layer can be effected in one step in this method.

Another possibility for producing and etching the mask layer in one step consists in applying the mask material to a shaping region of the semiconductor chip. The shaping region can be, in the case of a stripe laser, by way of example, the region where the ridge is formed. The mask material can be a closed or interrupted layer. During processing of the shaping region, in particular by means of etching, the mask material is at least partly removed, in particular etched away. The removed mask material can at least partly be deposited on the region to be structured. Preferably, in this method too, the etching process is continued during the depositing of the mask material, such that the region to be structured is etched and the structure elements are thus formed.

The form and size of the structure elements can be influenced by means of a suitable choice of the mask layer, the etching parameters and the etching method.

BRIEF DESCRIPTION OF THE DRAWINGS

Further features, advantages and developments of the invention will become apparent from the exemplary embodiments explained below in conjunction with FIGS. 1 to 10. In the figures.

DETAILED DESCRIPTION OF ILLUSTRATIVE EMBODIMENTS

Figure 1:
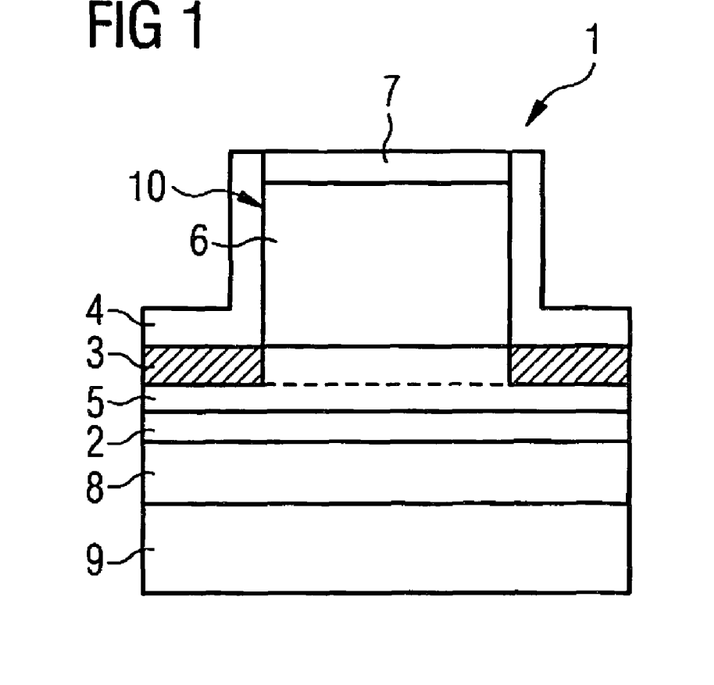
FIG. 1 shows a schematic cross-sectional view of a first exemplary embodiment of a radiation-emitting semiconductor chip according to the invention.
Figure 2:
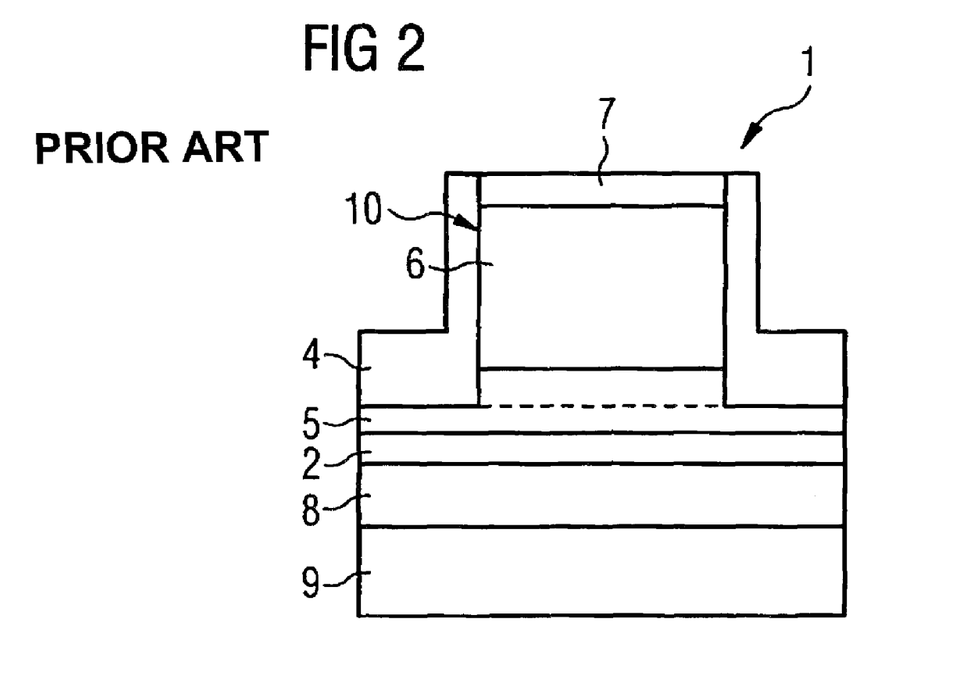
FIG. 2 shows a schematic cross-sectional view of a conventional radiation-emitting semiconductor chip.

FIG. 1 illustrates a radiation-emitting semiconductor chip 1, which is a laser diode chip. In particular, the laser diode chip is a stripe laser and includes a ridge 10. The ridge 10 extends as far as a first waveguide layer 5, which is directly adjacent to the active zone 2, and thus has an etching depth, which has the effect that, although a relatively small threshold current can be obtained, without structured regions 3 higher modes occur. A conventional semiconductor chip without structured regions is illustrated in FIG. 2. In contrast thereto, in the case of the semiconductor chip 1 shown in FIG. 1, structured regions 3 are advantageously arranged at two opposite sidewalls of the ridge 10.

The structured regions 3 include structure elements (not illustrated), which are arranged irregularly and have a width $b \leq \lambda$ and a distance $a \leq \lambda$ from one another. At higher wavelengths, that is to say for radiation at the long-wave end of the light spectrum, the structure elements can have, in particular, a width $b \leq \lambda/4$ and a distance $a \leq \lambda/4$. Furthermore, it is the case that preferably the ratio is $g:h \leq 1:10$, in particular $g:h = 1:10$.

In this exemplary embodiment, the structure elements are etched from the first waveguide layer 5 and thus contain the same material as the first waveguide layer 5. In particular, the material is a semiconductor material.

The structured regions 3 are coated by a passivation layer 4, which contains a silicon oxide, for example, and the passivation layer 4 fills interspaces between the individual structure elements. As a result of the interlinking between the structure elements projecting from the first waveguide layer 5 and the passivation layer 4, the passivation layer 4 adheres particularly well on the waveguide layer 5. Furthermore, the refractive index jump between the waveguide layer 5 and the passivation layer 4 can be reduced by means of the structure elements or by means of the structured region 3. For an intended interlayer that includes the structure elements and the interspaces filled by the passivation layer 4 and is thus arranged between the waveguide layer 5 and the passivation layer 4 has an effective refractive index $n_{eff}$ that lies between the first refractive index $n_1$ of the material of the structure elements and the second refractive index $n_2$ of the passivation layer 4.

The active zone 2 adjacent to the waveguide layer 5 can, in the simplest case, include a p-conducting and an n-conducting semiconductor layer, between which a radiation-generating pn junction is arranged. However, the active zone 2 can also have a double heterostructure, a single quantum well structure or a multiple quantum well structure (MQW). In this exemplary embodiment, the radiation generated in the active zone 2 is emitted through the edges of the semiconductor chip 1. The main emission direction runs parallel to the ridge 10, which is embodied in strip-type fashion.

The active zone 2 is arranged on a second waveguide layer 8. The first waveguide layer 5 and the second waveguide layer 8 have different conduction types. By way of example, the first waveguide layer 5 can be p-conducting and the second waveguide layer 8 can be n-conducting. The two waveguide layers 5 and 8 are in each case delimited by a cladding layer on a side remote from the active zone 2. The first cladding layer 6 has the same conductivity as the first waveguide layer 5, to which it is applied. The second cladding layer 9 has the same conduction type as the second waveguide layer 8, which is applied to the second cladding layer 9.

Preferably, all the layers apart from the passivation layer 4 and a contact layer 7 arranged on the ridge 10 are grown epitaxially on one another and form a layer stack of semiconductor layers. The semiconductor material of the semiconductor layers can be a material based on a nitride, phosphide or arsenide compound semiconductor.

Figure 3:
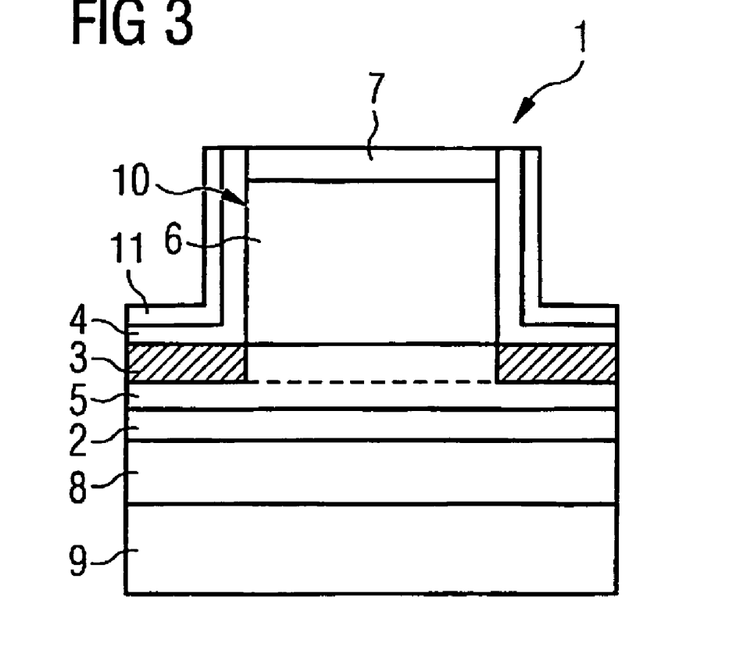
FIG. 3 shows a schematic cross-sectional view of a second exemplary embodiment of a radiation-emitting semiconductor chip according to the invention.
Figure 4:
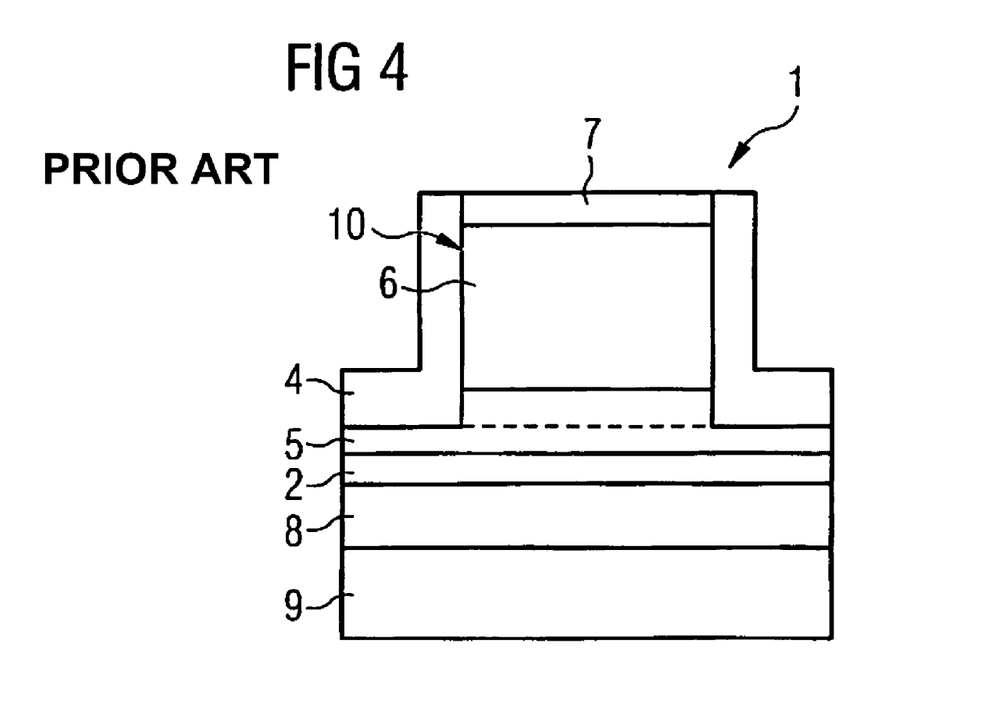
FIG. 4 shows a schematic cross-sectional view of a conventional radiation-emitting semiconductor chip.

FIG. 3 illustrates a radiation-emitting semiconductor chip 1 having a construction like the semiconductor chip 1 shown in FIG. 1 and comprising, in addition, an absorber layer 11. The absorber layer 11 is applied directly to the passivation layer 4. Advantageously, by means of the two separate layers, of which the passivation layer 4 is electrically insulating and the absorber layer 11 attenuates higher modes, the electrical insulation can be influenced independently of the degree of absorption. By contrast, in the case of a conventional semiconductor chip 1, as illustrated in FIG. 4, a single layer is provided for the electrical insulation and for mode attenuation, namely the absorbing passivation layer 4, which contains a mixture of an electrically insulating material and an absorbing material. In the exemplary embodiment in FIG. 4, this solution has to be pursued since a relatively large refractive index jump between the waveguide layer 5 and the passivation layer 4 typically has the effect that an optical wave cannot penetrate all that deeply into the passivation layer 4. If a separate absorber layer were used, the optical wave would scarcely be able to pass into it, which would result in weak attenuation of higher modes.

By means of the structured regions 3, the refractive index jump can be reduced in the exemplary embodiment in FIG. 3. As a result, an optical wave can penetrate more deeply into the layers and pass as far as the absorber layer 11.

Preferably, the absorber layer 11 contains an oxide or nitride, in particular ITO or an oxide or nitride of Si, Ti, Al, Ga, Nb, Zr, Ta, Hf, Zn, Mg, Rh, In. These materials are particularly suitable in the case of a semiconductor chip based on nitride compound semiconductors, as is preferred in the context of the present invention. By way of example, a silicon oxide can be used for the passivation layer 4.

Figure 5:
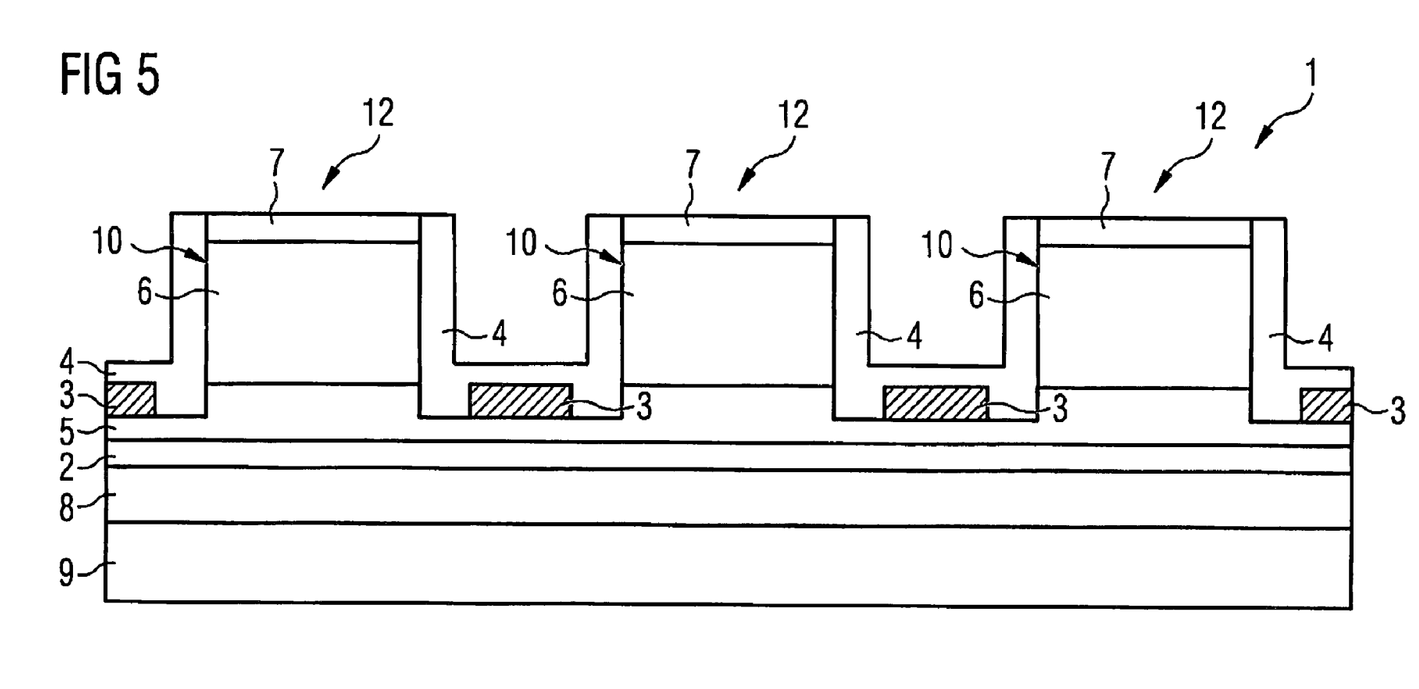
FIG. 5 shows a schematic cross-sectional view of a third exemplary embodiment of a radiation-emitting semiconductor chip according to the invention.

FIG. 5 shows a further exemplary embodiment of a radiation-emitting semiconductor chip 1 according to the invention. The semiconductor chip 1 illustrated here is a laser array comprising a plurality of stripe lasers 12 and a plurality of structured regions 3, wherein a structured region 3 is in each case arranged between two adjacent stripe lasers 12. Crosstalk of scattered light from one stripe laser to the other can be better suppressed by means of the structured regions 3.

The stripe lasers 12 are not individual components. Rather, the semiconductor chip 1 has a continuous active zone 2. Only the front-side contact-connection of the stripe lasers 12 is effected separately by means of the first contact layers 7.

In the exemplary embodiment illustrated in FIG. 5, the stripe lasers 12 are constructed like the radiation-emitting semiconductor chip 1 illustrated in FIG. 1. However, the stripe lasers 12 can also be constructed like the radiation-emitting semiconductor chip 1 illustrated in FIG. 3.

If a construction without an absorber layer is chosen, then the refractive index transition between the layer stack and the environment and thus the probability of total reflection can be reduced by means of the structured regions 3. As a result, scattered light can couple out better from the semiconductor chip 1, whereby crosstalk from one stripe laser to the other can be suppressed. If an absorber layer is used on the passivation layer 4, the scattered light can advantageously be absorbed.

The structure elements can have a width $\lambda < b \leq 4$ µm. In this case, the structure elements act as scattering centers. However, the structure elements can also have a width $b \leq \lambda$, at longer wavelengths also $b \leq \lambda/4$, such that the structure elements surrounded by the passivation layer 4 constitute an interlayer having an effective refractive index $n_{eff}$.

Figure 6:
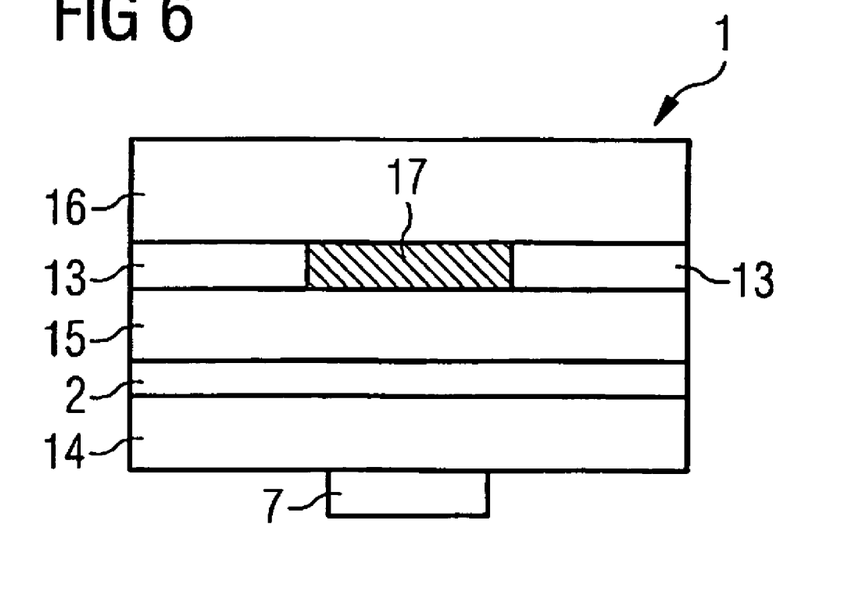
FIG. 6 shows a schematic cross-sectional view of a fourth exemplary embodiment of a radiation-emitting semiconductor chip according to the invention.
Figure 7:
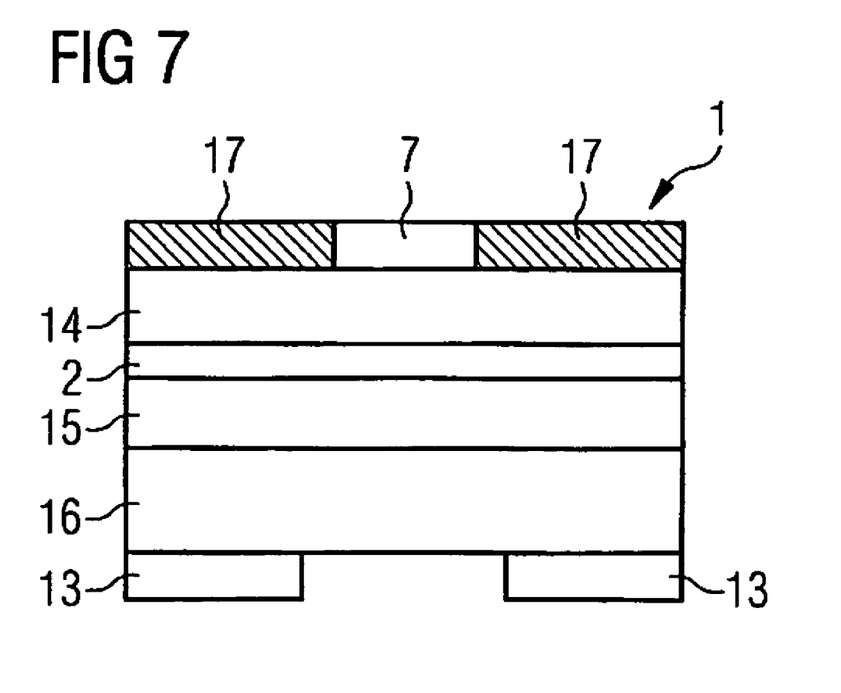
FIG. 7 shows a schematic cross-sectional view of a fifth exemplary embodiment of a radiation-emitting semiconductor chip according to the invention.
Figure 8:
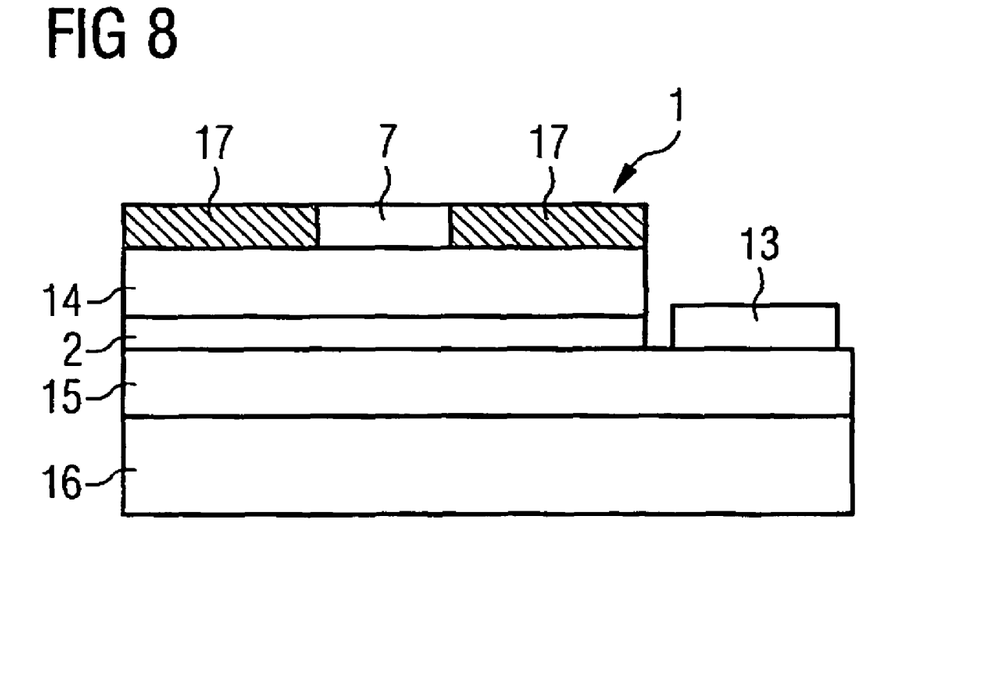
FIG. 8 shows a schematic cross-sectional view of a sixth exemplary embodiment of a radiation-emitting semiconductor chip according to the invention.

FIGS. 6 to 8 show radiation-emitting semiconductor chips 1. The radiation-emitting semiconductor chips 1 are preferably light-emitting diodes, which, in contrast to the laser diodes illustrated in FIGS. 1 to 5, do not emit coherent radiation.

What is common to the semiconductor chips 1 in FIGS. 6 to 8 is that they have a dielectric mirror 17 having a first dielectric layer (not illustrated) and a second dielectric layer (not illustrated). The structured region (not illustrated) is situated at the transition between the first and the second dielectric layers.

FIG. 6 shows a semiconductor chip 1, which is a thin-film semiconductor chip. The thin-film semiconductor chip 1 illustrated includes a layer stack having epitaxially grown semiconductor layers 15, 2, 14, from which the growth substrate is stripped away. The layer 14 is a first layer having a first conduction type, which is preferably p-conducting, and the layer 15 is a second layer having a second conduction type, which is preferably n-conducting.

The layer stack is arranged on the carrier 16, wherein the dielectric mirror 17 is situated between the carrier 16 and the layer stack. The dielectric mirror 17 does not extend over the entire area of the layer stack, but rather is surrounded by a second contact layer 13, by means of which the active zone 2 is electrically connected to the electrically conductive carrier 16. A further electrical contact, the first contact layer 7, is arranged on a side of the active zone 2 that is remote from the dielectric mirror 17. This side constitutes the coupling-out side of the semiconductor chip 1.

By means of the dielectric mirror 17, the radiation emitted by the active zone 2 in the direction of the dielectric mirror 17 can be effectively reflected in the direction of the coupling-out side, as is explained below.

The structure elements having a width $b \leq \lambda$ are preferably formed from the first layer of the dielectric mirror 17 and surrounded by the second layer of the dielectric mirror 17. By means of the structure elements being coated, and by means of the resultant interlayer, an optical wave can better penetrate into the second layer and interact with the latter. The first layer contains a first material having a first refractive index $n_1$ and the second layer contains a second material having a second refractive index $n_2$. Preferably, the second layer contains inclusions, in particular air inclusions, having a refractive index that is less than the second refractive index $n_2$. As a result, the second refractive index $n_2$ and thus the effective refractive index $n_{eff}$ can be reduced. This has the advantage that the critical angle of total reflection is reduced, such that a larger proportion of radiation can be reflected in the direction of the coupling-out side of the radiation-emitting semiconductor chip 1 by means of total reflection occurring at the dielectric mirror 17. The first and the second layers can each contain an oxide, nitride or oxynitride of Si, Ti, Al, Ga, Nb, Zr, Ta, Hf, Zn, Mg, Rh, In.

The radiation-emitting semiconductor chips 1 illustrated in FIGS. 7 and 8 are based on a corresponding manner of functioning. Both semiconductor chips 1 include a transparent substrate 16. Consequently, the coupling-out of radiation can be effected through the substrate 16. The dielectric mirror 17 is arranged on a side of the semiconductor chip 1 that lies opposite the substrate 16 and thus also opposite the coupling-out side. The dielectric mirror 17 covers an outer region of the layer stack. The first contact layer 7 is arranged in the inner region.

In the case of the semiconductor chip 1 in FIG. 7, the second contact layer 13 is applied on the substrate 16. By contrast, the semiconductor chip 1 in FIG. 8 includes the second contact layer 13 on the second layer 15. The first and the second layers 14 and 15 and also the active zone 2 can in each case consist of a plurality of partial layers. This applies to all the exemplary embodiments described.

Figure 9:
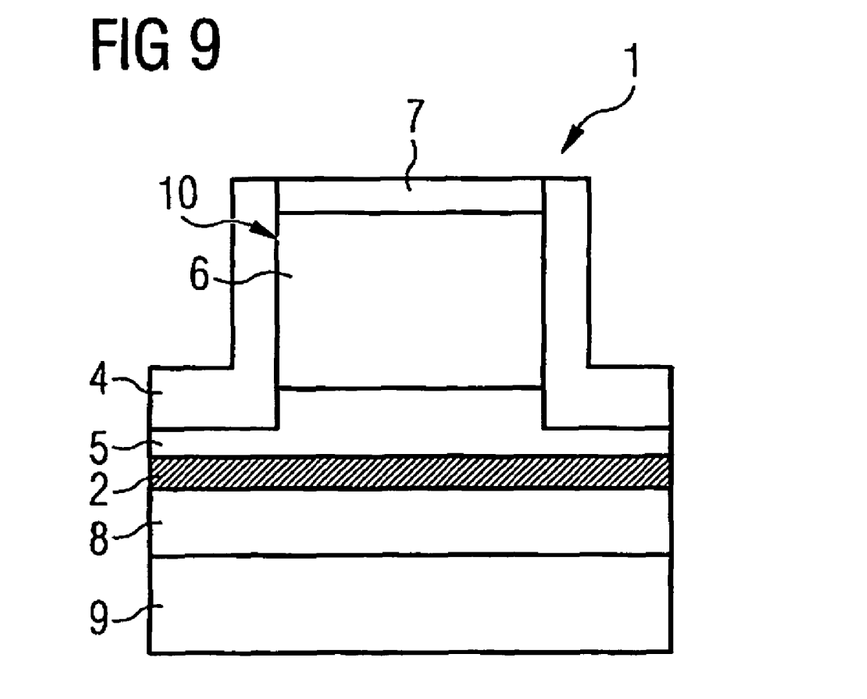
FIG. 9 shows a schematic cross-sectional view of a seventh exemplary embodiment of a radiation-emitting semiconductor chip according to the invention.

FIG. 9 shows a radiation-emitting semiconductor chip 1, which is a laser diode and, in terms of its construction, largely corresponds to the stripe lasers in FIGS. 1 to 4.

In the embodiment illustrated, the structured region (not designated) including structure elements having the width $b \leq \lambda$ is arranged in the active zone 2. In particular, the structured region forms a quantum well structure. An improved confinement of the charge carriers in the active zone 2 can be obtained by means of the structured region.

An exemplary embodiment of a method according to the invention will now be described in association with FIGS. 10A to 10C.

Figure 10A:
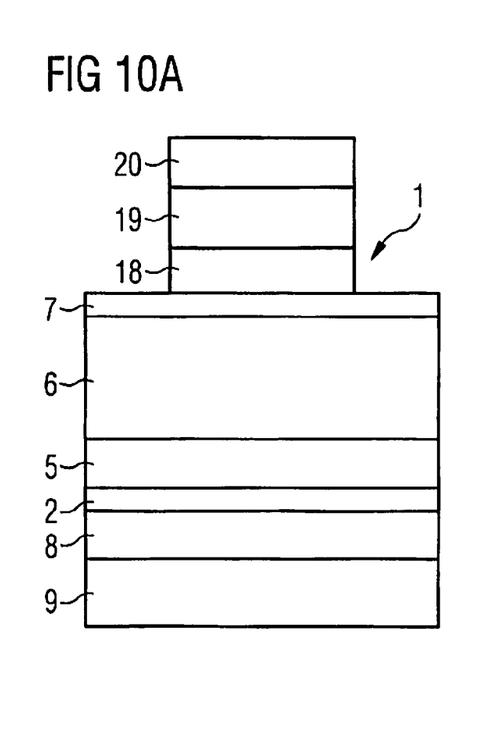
FIGS. 10A, 10B and 10C show different steps of an exemplary embodiment of a method according to the invention.

In this case, a shaping mask 18 is applied to a layer stack of a semiconductor chip 1 comprising the layers 7, 6, 5, 2, 8 and 9, which still require shaping (see FIG. 10A). By way of example, the shaping mask 18 can be an etching mask for producing a ridge 10 (see FIG. 10B).

Figure 10B:
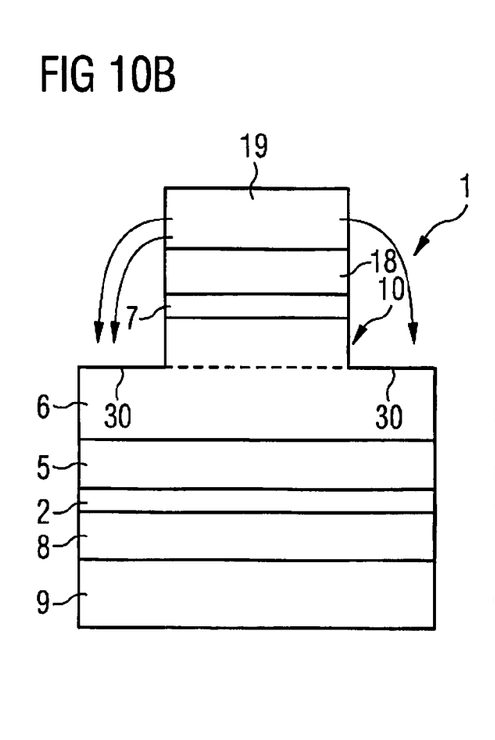
Figure 10C:
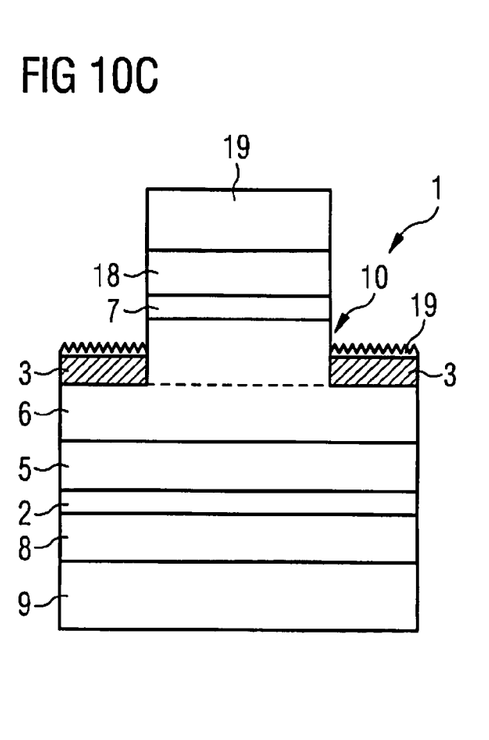

A mask material 19 is applied to the shaping mask 18, the mask material being provided for producing the structured region 3 (see FIG. 10C). In this case, the mask material 19 is arranged at a distance from regions 30 to be structured. The mask material 19 can contain a metal, for example, Ni, Ti or Pt, a dielectric material, for example an oxide or nitride of Si, Ti or Zr, or a polymer, for example, a photoresist. Finally, a protective layer 20 can be applied to the mask material 19.

In order to produce the ridge 10, an etching process is carried out (see FIG. 10B). In this case, the first contact layer 7 and the first waveguide layer 6 are structured in such a way that the ridge 10 is formed. The protective layer 20 is completely etched away during this process. The etching depth of the ridge 10 can be increased by further etching. In this case, the mask material 19 serving for producing the structure elements is at least partly removed and can deposit on the regions 30 to be structured (see FIG. 10B).

Since the etching process is continued, structuring of the regions 30 takes place at the same time, with the result that the structured regions 3 having structure elements are formed (see FIG. 10C). The structure elements can still include mask material at their tip even after the etching process, which mask material does not necessarily have to be stripped away.

The method described in association with FIGS. 10A to 10C leads to a type of self-assembled production of the structure elements since the structure elements are formed during the etching process without the targeted production of a mask layer.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. A radiation-emitting semiconductor chip comprising:
an active zone for generating radiation having a wavelength $\lambda$; and
a structured region comprising irregularly arranged structure elements comprising a first material having a first refractive index $n_1$, wherein the structure elements are surrounded by a medium comprising a second material having a second refractive index $n_2$, wherein a thickness of an interlayer comprising the structure elements and the medium corresponds to a maximum height of the structure elements, and wherein an effective refractive index $n_{eff}$ of the interlayer equates to $n_2 < n_{eff} < n_1$ and wherein a base area width of the respective structure elements is less than a height h of the respective structure elements.

2. The radiation-emitting semiconductor chip as claimed in claim 1, wherein the structure elements each have a width $b \leq 4$ μm and a distance $a \leq 4$ μm from one another.

3. The radiation-emitting semiconductor chip as claimed in claim 1, wherein the structure elements each have a width $b \leq \lambda$ and a distance $a \leq \lambda$ from one another.

4. The radiation-emitting semiconductor chip as claimed in claim 1, wherein the effective refractive index $n_{eff}$ is set by a concentration of the first material relative to a concentration of the second material in the interlayer.

5. The radiation-emitting semiconductor chip as claimed in claim 1, wherein the semiconductor chip is a stripe laser having a ridge and wherein the structured region is arranged at sidewalls of the ridge.

6. The radiation-emitting semiconductor chip as claimed in claim 5 wherein the structure elements are formed from a semiconductor layer of the semiconductor chip and the medium is a passivation layer or absorber layer covering the structure elements.

7. The radiation-emitting semiconductor chip as claimed in claim 1, further comprising a dielectric mirror, wherein the structure elements are formed from a first layer of the dielectric minor and are surrounded by a second layer of the dielectric minor.

8. The radiation-emitting semiconductor chip as claimed in claim 1, wherein the active zone comprises the structured region which forms a quantum well structure.

9. The radiation-emitting semiconductor chip as claimed in claim 1, wherein a base area width g of the respective structure elements is greater than a height h of the respective structure elements.

10. The radiation-emitting semiconductor chip as claimed in claim 9, wherein the semiconductor chip is a light-emitting diode, and wherein the structured region is a coupling-out layer of the light-emitting diode.

11. The radiation-emitting semiconductor chip as claimed in claim 9, wherein the semiconductor chip is a stripe laser having a ridge, and wherein the structured region is arranged alongside the ridge for coupling out scattered light.

* * * * *

UNITED STATES PATENT AND TRADEMARK OFFICE
CERTIFICATE OF CORRECTION

PATENT NO. : 8,340,146 B2
APPLICATION NO. : 12/679832
DATED : December 25, 2012
INVENTOR(S) : Lell et al.

It is certified that error appears in the above-identified patent and that said Letters Patent is hereby corrected as shown below:

In the Claims:

In Col. 11, line 2, claim 7, delete "minor" and insert --mirror--.
In Col. 11, line 3, claim 7, delete "minor" and insert --mirror--.

Signed and Sealed this
Twenty-first Day of May, 2013

Teresa Stanek Rea
*Acting Director of the United States Patent and Trademark Office*